United States Patent [19]

Dumbeck

[11] 4,141,244

[45] Feb. 27, 1979

[54] LOAD INDICATING METERING DEVICES FOR MOTOR DRIVEN LOADS

[75] Inventor: Robert F. Dumbeck, Elgin, Tex.

[73] Assignee: Rexnord Inc., Milwaukee, Wis.

[21] Appl. No.: 833,651

[22] Filed: Sep. 15, 1977

Related U.S. Application Data

[63] Continuation-in-part of Ser. No. 675,780, Apr. 12, 1976, Pat. No. 4,063,112, which is a continuation-in-part of Ser. No. 548,011, Feb. 7, 1975, abandoned.

[51] Int. Cl.$^2$ .............................................. G01L 3/00
[52] U.S. Cl. .................................. 73/133 R; 318/490
[58] Field of Search .................. 73/116, 133 R, 136 R; 324/160, 163, 164; 340/271; 318/490

[56] References Cited

U.S. PATENT DOCUMENTS

| | | | |
|---|---|---|---|
| 2,841,746 | 7/1958 | Mawhinney | 324/110 UX |
| 3,201,776 | 8/1965 | Morrow et al. | 340/267 R X |
| 3,439,245 | 4/1969 | Perdue | 318/490 X |
| 3,729,989 | 5/1973 | Little | 73/133 R |
| 3,739,367 | 6/1973 | Fathauer | 340/248 P X |
| 3,913,084 | 10/1975 | Bollinger et al. | 340/261 |

Primary Examiner—Jerry W. Myracle

[57] ABSTRACT

Power transmission systems having a movable member presenting variable load conditions on a motor connected thereto by means of a power transmission device are monitored by load sensing means. Sensed signals are processed to produce visual display conditions and corresponding control signals for selected motor loading parameters. The system accurately and simply measures and displays load conditions in flexible calibrated scale factor and digital form reducing possibilities of human readout error. No wiring or mechanical connections are necessary in the power train and reliable, sensitive output signals are produced with simple and miniature retrofittable electronic processing circuits. Alarm signals exceeding predetermined threshold load levels are stored digitally in a flip-flop circuit or equivalent relay for memory and control of external devices. Thus, the display form includes calibrated analog metering scale and digital memory type data processing devices permitting monitoring to correct system operating conditions when the motor is overloaded. Thus, the power transmission system can operate with motor ratings substantially equal to or less than expected full load conditions to substantially reduce initial equipment cost and operating expenses over equipment life.

16 Claims, 5 Drawing Figures

LOAD INDICATING METERING DEVICES FOR MOTOR DRIVEN LOADS

This application is a continuation-in-part of copending U.S. Ser. No. 675,780 filed Apr. 12, 1976, now U.S. Pat. No. 4,063,112 issued Dec. 13, 1977, which was itself a continuation-in-part of U.S. Ser. No. 548,011 filed Feb. 7, 1975, now abandoned.

This invention relates to motor load monitoring and control apparatus and more specifically it relates to metering and alarm devices responding to predetermined motor load parameters.

BACKGROUND OF THE INVENTION

The disclosure of this case incorporates by reference the entire contents of the aforesaid patent, and thus for purpose of simplicity of presentation does not duplicate herein the detailed circuits found therein. However, for purpose of convenient cross reference where applicable similar reference character designations are used herein.

In various industrial system installations for transmission of power from motors to various operating loads, it is essential to protect expensive industrial machinery, motors, etc. in the event something goes wrong, or load variations exceed specified limits. This may be done either by providing monitoring metering devices with visual scales or with corresponding automatically operable digital alarm switching devices used to control power or safety devices either on site or at remote stations.

In load control systems wherever human monitoring is required, there remains some chance for error. Thus, when load conditions are displayed upon a calibrated meter scale for example it is not unusual to misinterpret the reading either (1) by misunderstanding the scale factor, the scale terms, or the scale range, (2) by misreading the scale, or (3) by making errors in extrapolating scale readings into alternate specific load parameters. Many prior art meter scales for example are in arbitrary scale units and provided with calibration and correction charts for extrapolation and interpretation of readings. Particularly where alarms need be actuated for emergency conditions, there is not time for this. Even when timing is no problem this is a primary source of error because it involves human intervention and interpretation. Also, the load parameters of interest vary from horsepower, speed, torque, etc. in various installations.

Furthermore in metering and control circuits it is desirable to improve accuracy of readings and sensitivity. For accurate instrumentation, amplifiers and signal processing circuits or devices are always a source of potential error or nonlinearity. Thus, the simpler the data processing system is the more reliability and freedom from error. Also, the more accurate the readings can be detected in the first instance, the better. Most systems have a detection accuracy limitation and it is difficult indeed to carefully control very small changes in speed or loading upon a movable terminal load element such as a drill bit work tool, baling machine, etc. If this can be done, the system energy can be cut down significantly by employing motors of smaller rating and protecting them against overload. This becomes significantly important in today's energy saving environment.

Installation of prior art measuring devices to a large degree either require access to wiring or mechanical linkages and thus are difficult and expensive to retrofit and need to be special or custom tailored for use in different kinds of systems. Such would prohibit use in most cases since O.E.M. produced equipment generally cannot justify the cost of custom tailored load protection devices.

OBJECTIVES OF THE INVENTION

It is therefore a general object of this invention to provide improved efficient low power consuming monitored power transmission systems with accurate and simple metering devices.

A more specific object is to provide monitoring meters reading directly out on a scale calibrated in a monitored parameter of the system load conditions such as speed, torque, horsepower, percentage of load, etc.

Another important object of the invention is to provide automated load condition monitoring means for power transmission systems eliminating human errors in reading and interpretation of data.

A further objective of the invention is to provide improved universal type electronic load monitoring, alarm and control systems adaptable to various load conditions and measured parameters either as original equipment or by retrofit.

A most important object of the invention is to provide safety systems for electronically monitoring power transmission systems to avoid excessive energy, damage to equipment and deterioration of output quality.

A still further object of the invention is to provide load monitoring equipment of small size compatible with mounting in or near an electric motor.

Another object of the invention is to provide electronic load condition monitoring equipment that neither loads or requires mechanical interfaces in a power transmission system thereby to permit simple retrofit without access to motor wiring, existing electrical circuits or mechanical linkages.

BRIEF DESCRIPTION OF THE INVENTION

There is therefore afforded by this invention a monitored motor driven power transmission system moving a member presenting a variable load condition having a simplified accessory installed to monitor a motor loading parameter without connections to the motor wiring or the mechanical linkages of the power transmission train. Shaft speed is electronically measured by a non-contacting sensor excited by an accessible moving member in the power transmission train, such as the motor shaft, and converted to an output signal for display and control purposes. Calibrated scales display a direct reading scale factor of at least one selected parameter displaying the variable load condition imposed on the motor such as torque for a drill press, gallons per minute for a pump, speed of a conveyor belt, percent of full motor load for motor protection, slip for clutches or induction motors, etc. The system provides alarm conditions at selected threshold conditions for the monitored parameters, memory of alarm conditions and control linkages for automated system operation. The motor full load rating is substantially equal to or less than that of the expected full load conditions, thereby substantially reducing operating power over life and decreasing equipment costs.

THE DRAWINGS

Other features, objects and advantages of the invention will become apparent from reference to the following detailed description of preferred embodiments of the invention and the accompanying drawings, wherein.

DETAILED DESCRIPTION OF THE INVENTION

Figure 1:
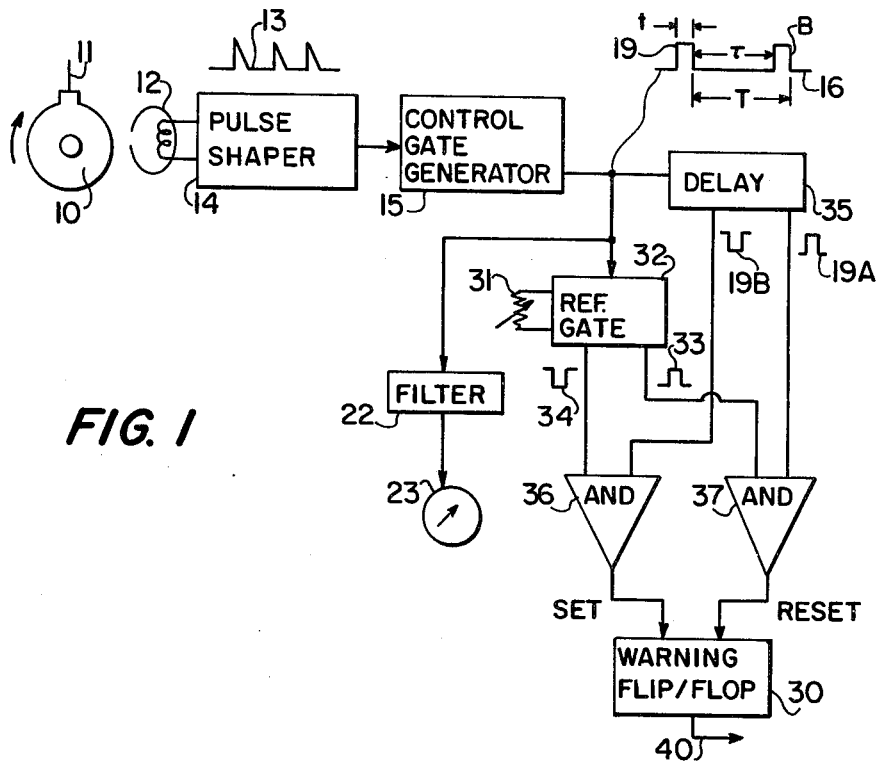
FIG. 1 is a block system diagram of an electronic motor shaft speed monitoring accessory system that can be retrofit for processing pulses to provide a visible meter display and electronic control functions.

With reference to FIG. 1, a motor shaft 10, in a power transmission train driving a movable member presenting a variable load such as a drill press or sewage sludge processing tank, rotates as shown by the arrow to present a projecting ferrous portion 11 to a magnetic gap detector 12 each revolution of the shaft. This produces a succession of pulses 13 indicating the speed of rotation of the motor shaft 10. These pulses are shaped and processed in pulse shaper circuit 14 to provide trigger pulses for the control gate generator circuit 15 affording output waveform 16, wherein the B pulse portion varies in time duration as a function of the change of motor shaft 10 speed and therefore displaying a load condition affecting the motor. The motor is preferentially rated for full load operation substantially equal to or even less than the expected peak loads in the variable load condition, since the metering and alarm conditions can indicate those unusual situations where corrections need be made. The expected chronic peak loads are taken into account in choosing motor ratings, but occasional temporary short duty cycle overloads may be sustained without system damage and the monitored systems of this invention therefore provide for a more efficient and lower cost system. For example, a warning may indicate a tolerable short term overload while an alarm may disconnect motor power, etc.

By use of an appropriate filter 22 these B pulses will therefore present an analog readout on meter scale 23 which reflects the motor load condition, typically by a linear relationship of the percentage of rated motor load over the critical range of 75% to 125% with rated 100% load at midscale.

To digitally monitor the load characteristics and provide warning signals suitable for control of motor load devices or systems, the warning flip-flop 30 may be used for operation by the B waveform signal pulses 19 produced by control gate generator 15. A desired threshold load warning or alarm condition may be set by means of variable adjustment means 31 on reference warning gate generator 32. Thus, positive 33 and negative 34 square waveforms of predetermined time duration are produced as the output signals of a multivibrator of the one-shot variety that is triggered by the leading edge of the B waveform 19 for synchronization purposes.

Delay circuit 35 provides a short delay of about forty nanoseconds and produces delayed B waveform pulses 19 in positive (19A) and negative (19B) polarity. comparison circuits such as AND circuits 36 and 37 therefore can process the corresponding negative and positive pulses to set and reset the warning flip-flop 30 as a function of different time duration of input square wave signals. The delay prevents erroneous triggers at the warning gate comparison circuits 36 and 37 due to circuit timing conditions.

Suppose the predetermined load threshold level of 110% is selected by the threshold adjustment means 31. This provides reference pulses 33, 34 with a fixed time duration typically 4.1 milliseconds. These pulses are time synchronized with the start of the B pulses of waveform 19. Then whenever the B pulse 19 from control gate generator is longer than the warning gate pulse 34, the AND circuit 36 produces a trigger pulse which sets warning flip-flop 30 to produce an alarm at output lead 40. Conversely if the control gate pulse 19 is shorter than the warning gate pulse 33, then AND gate 37 resets the warning flip-flop to show that the motor is not past the overload threshold set on adjustment 31.

Figure 2:
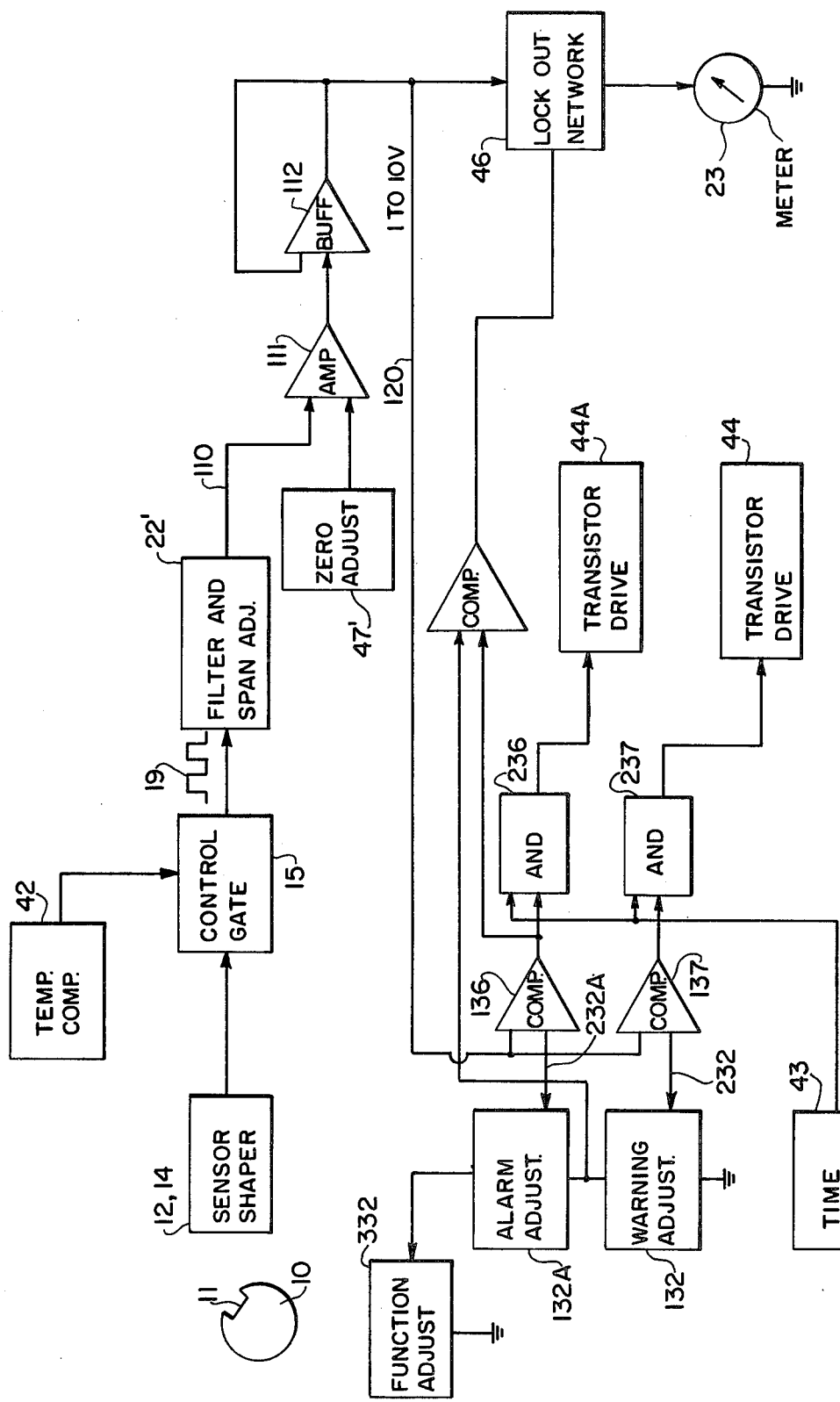
FIG. 2 is a schematic circuit diagram of a power transmission train monitoring system afforded by this invention.

As shown in the FIG. 2 block schematic diagram, basically the variable duration B signal pulses 19 are converted in the filter circuit 22' to a d-c motor load signal level at lead 110 that varies in magnitude as a function of the duration of the signal pulses. This is the same signal used to operate analog meter movement 23 of FIG. 1. In this embodiment, the meter 23 is driven single-ended by amplifier 111 and buffer 112 by way of the gate lock out network 46. The zero meter output signal adjustment is made by zero adjust means 47' as an input to differential amplifier 111. Thus, a load signal level is derived and adjusted for span in circuit 22', and a zero level adjustment is available in circuit 47'. The resulting voltage level at lead 120 preferably has a voltage swing of one to ten volts as derived from the control gate B pulses 19.

Analog comparison circuits 136 and 137 provide an output voltage for operating following AND circuits 236 and 237, if opened by time delay circuit 43, whenever the signal voltage level exceeds that of a variably selected input threshold level chosen in alarm circuits 132 and 132A, the adjustment feature thereof being indicated by an arrow head on the threshold leads 232 and 232A so that a threshold comparison voltage in the one to ten volt range will be made available at either comparator 136 or 137. A coarse adjustment of threshold ranges may be made available at circuit 332 which includes a suitable input source of d-c potential.

In operation therefore the comparison devices 136 and 137 will provide a signal at transistor output circuits 44 and 44A whenever the motor load exceeds a predetermined value represented by voltage threshold settings on circuits 132, 132A and 332. This output analog signal amounts to a gating signal that may be used to control utilization circuits of various kinds by operating relays or the like, as in the previously described embodiment.

Figure 3:
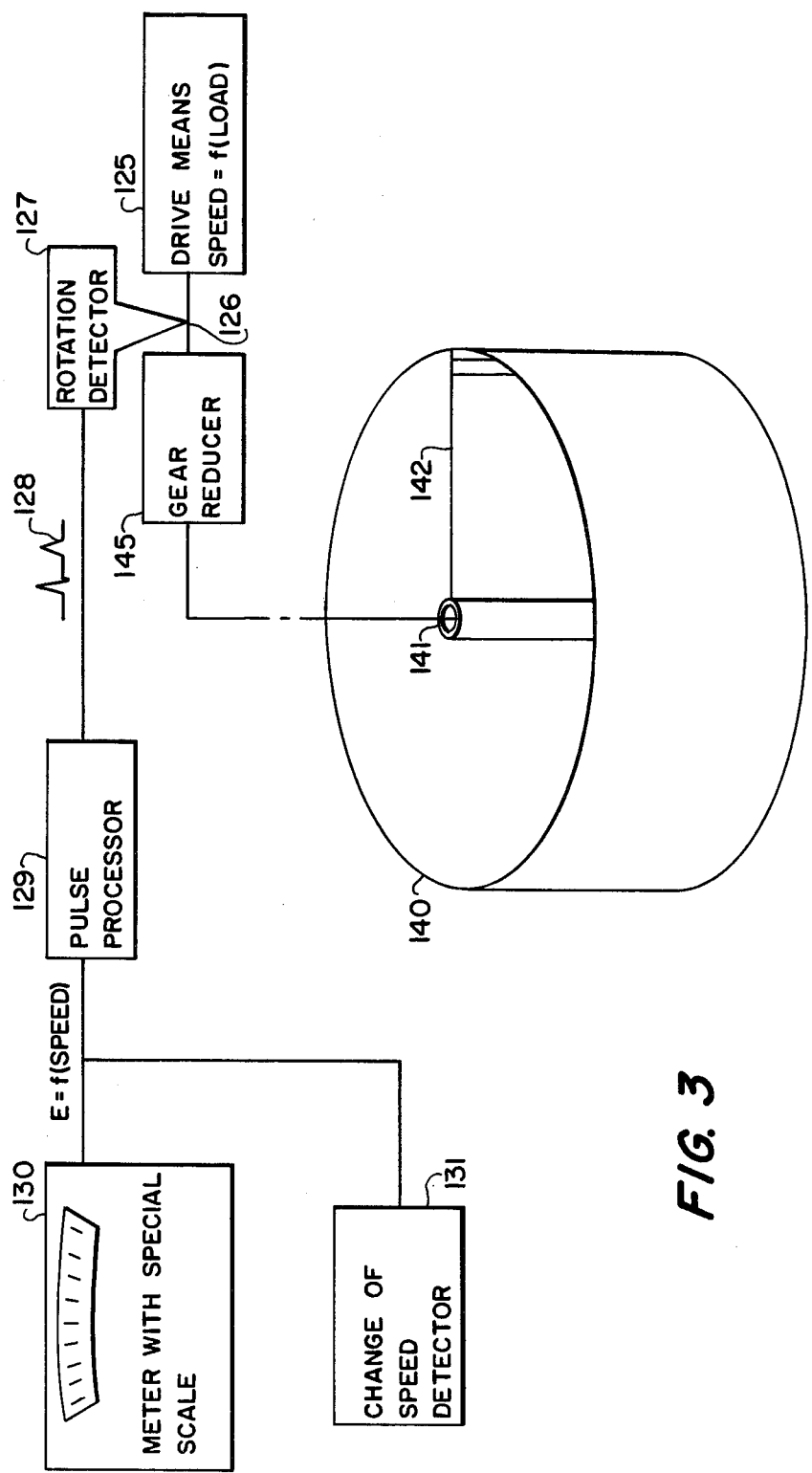
FIG. 3 is a diagrammatic system view, partly in block diagram form of a typical monitored power transmission system with a movable output member driven by a motor and presenting a variable load condition thereto.

The principles of this invention are set forth in more general form in the system diagram of FIG. 3. Thus the drive means 125 may be an engine or motor (other than synchronous) which has a speed function that varies with load. The speed is detected as a function of the rotation of a shaft 126, for example, by means of a rotation detector 127 conveniently of the type hereinbefore described to produce output pulses 128, in this case electronic signals.

Such output pulses 128 comprise a train or sequence of individual pulses having interval spacings or repetition rate frequencies that are a function of the rotation speed of shaft 126. These pulses are processed by means 129 to provide an output signal E as a function of the drive means speed, conveniently in the form of voltage or current.

The output indicator may be a visually indicating meter 130 which is calibrated to have a special scale reading directly in speed, load, horsepower, etc., as will hereinafter be discussed more completely. An alternate form might be an alarm or change of speed detector 131 calibrated for producing an output in response to a predetermined variation of normal speed for example. In one form this could be a relay type meter. In the simplest form where accuracy is not important the meter 130 could simply integrate as with an R-C circuit the series of pulses which were standardized in shape and amplitude by pulse processor device 129. Then the meter reading would be a function of repetition rate which would reflect the speed of the drive means 125.

The load device on the drive means 125 in this case is shown as an industrial processor 140 such as a bakery mixer or a sludge processor having a rotatable shaft 141 and work arm 142 driven by drive means 125 through a gear reducer box 145.

Because of the use of a gear reducer which may provide for example a 20,000 to 1 reduction of the drive shaft speed, the drive means is particularly sensitive to overloads. Thus a half horsepower induction motor operating at full load RPM of 1725 may drive a 50 foot (15.24 meter) diameter clarifier in a sewage disposal plant to process a sludge load having an average of seven pounds per foot (30.48 cm) through gear box 145 with an overall efficiency of 60%.

Under such conditions as overload on work arm 142 would significantly increase the load on the motor (drive means 125), which could be readily sensed to produce an alarm from detector 131 or to produce a scale reading on meter 130 or an equivalent recording chart of the instantaneous dynamic load conditions at all times.

It has been shown in the hereinbefore mentioned patent how to produce a scale factor on meter 130 as a linear function of the percentage of load on the motor. However, the scale can also be made to read directly in horsepower. In such case some simple calculations show how a linear meter scale can produce a reading in horsepower for the system being monitored, which meter therefore requires only a simple scale factor change to show load, motor, slip, horsepower, etc. The measured intervals of rotation of the shaft 126 can be converted to a direct meter scale reading in horsepower, which may be more meaningful, and more convenient for many industrial applications.

To calculate an exemplary scale factor for reading the instantaneous dynamic horsepower of the drive means on the scale of meter 130 consider the following:

Horsepower is equal to (Torque load × RPM)/K (1) where the constant K is a function of units and the place of measurement of RPM. Efficiency can be expressed as a ratio of output horsepower to input horsepower which in the aforesaid application is 60%. With said 50 ft. (15.24 meter) diameter clarifier with an average load of 7 lbs. per ft. of sludge load each pound per foot (30.48 cm) of build up of sludge on the scraper arm (142, FIG. 3) can be registered directly on the special scale of meter 130.

If the meter normally registers 75% to 125% of load as discussed hereinbefore, this represents 50% of the total motor horsepower on a linear scale. With 100 scale divisions each division then can be identified as 0.005 horsepower at the motor shaft with the half horsepower motor.

If the meter is to read torque in pounds per foot build up of sludge on the scraper arm 142, then the loading on the clarifier output drive is considered. With the 20,000 to 1 reducer on RPM, the horsepower is ascertained by equation (1) above and the efficiency factor is introduced we can determine the 100% meter scale position to be 0.12 input Hp. Then with a loading of 8 lbs. per foot the same process shows input Hp = 0.1388 or 0.0188 Hp per ft. of sludge. Converting this by dividing the motor rating 0.0188/5 Hp = 3.76% increase of Hp at the motor, which is equal to 3.76 scale divisions. Therefore new meter scale markers can be so identified to produce special output readings in terms of the arbitrary loading factor discussed above or in terms with other terms meaningful to the process or project at which the load monitoring equipment of this invention is employed.

Figure 4:
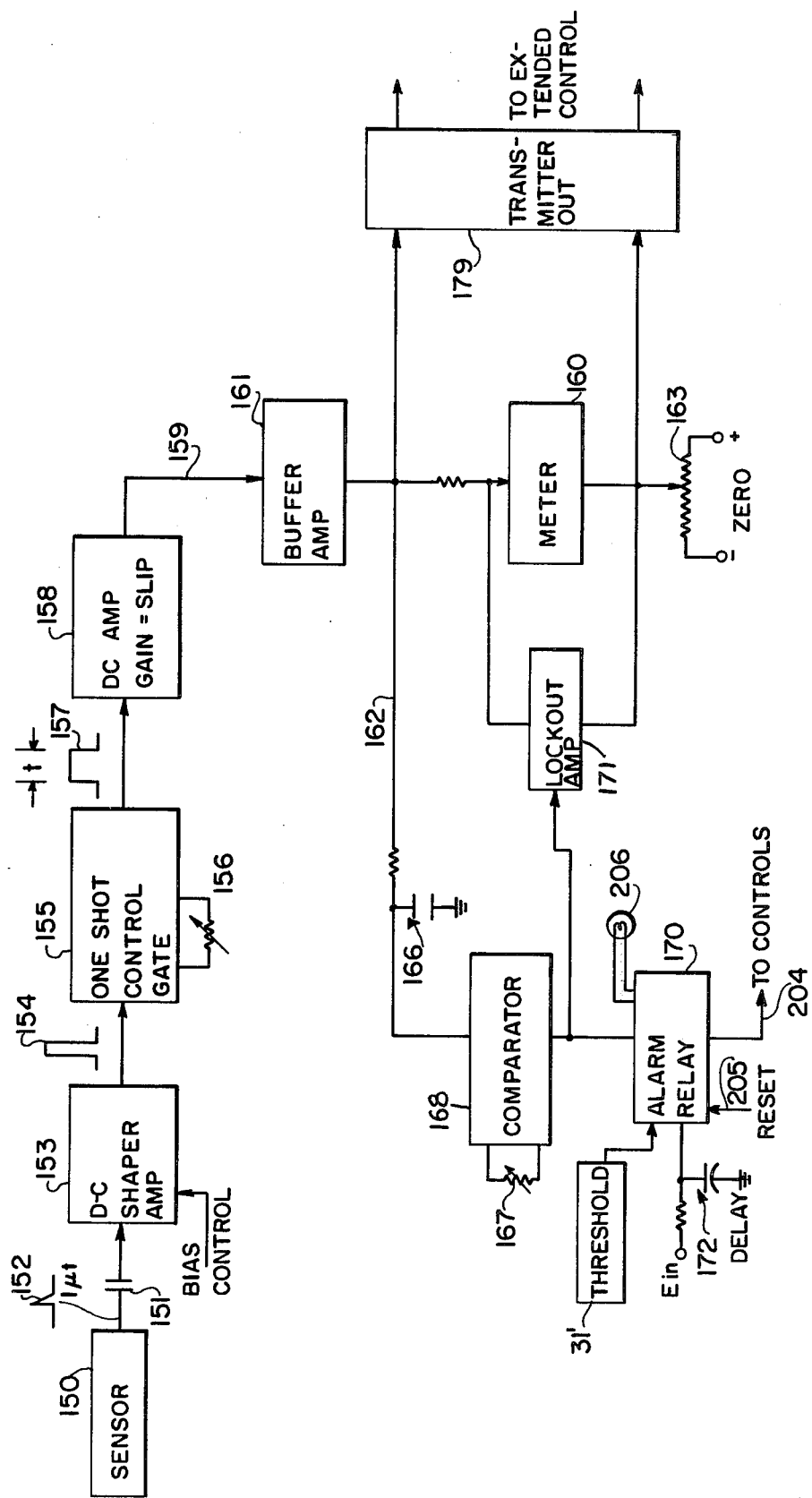
FIG. 4 is a block circuit diagram of a typical non-contact retrofittable shaft speed monitoring electronic circuit embodiment of the invention.

FIG. 4 represents a preferred circuit block diagram of a system constructed in accordance with the principles hereinbefore explained, particularly with respect to the general system operation.

A shaft rotation sensor 150 which may be Airpax No. 40004 provides an output pulse 152 of about 130 m.v. a-c connected by capacitor 151 to d-c shaper amplifier 153 which produces a saturated 12 v output pulse 154. The leading edge then fires a one-shot gate control circuit 155 set by adjustment 156 for a nominal gate length t of gate waveform 157 of 3.5 m.s. (corresponding to the waveform of FIG. 2). D.C. Amplifier 158 has a characteristic that the gain is equal to the slip so that the output 159 therefore drives meter 160 through a buffer amplifier 161 which permits a feed off circuit 162 without loading the meter. A meter zero circuit 163 as hereinbefore described permits setting of the meter mid-scale at 100% load for example.

An integrator circuit 166 together with adjustment 167 permits comparator amplifier 168 to operate for any continued overload to fire an alarm relay 170. Also it may serve by means of lockout amplifier 171 to disconnect or shunt the meter 160. To prevent false alarms when the system is first energized, an input current delay circuit 172 is provided to the alarm amplifier and relay circuit 170.

As seen from FIG. 4 external circuits may be controlled by an appropriate output circuit 170 at any threshold setting 31'.

By appropriate choice of threshold levels at 31' also the alarm relay memory 170 of FIG. 4 may be set for various control parameter readings such as 110% of full rated motor load. A manual reset connection 205 for the alarm relay 170 may be interposed if desirable to assure that the overload condition indication displayed on visual lamp indicator 206 need be manually released before the device controlled by lead 204 is again returned to normal operation. Typically lead 204 can be a power lead connection to the motor 210 in FIG. 5.

Figure 5:
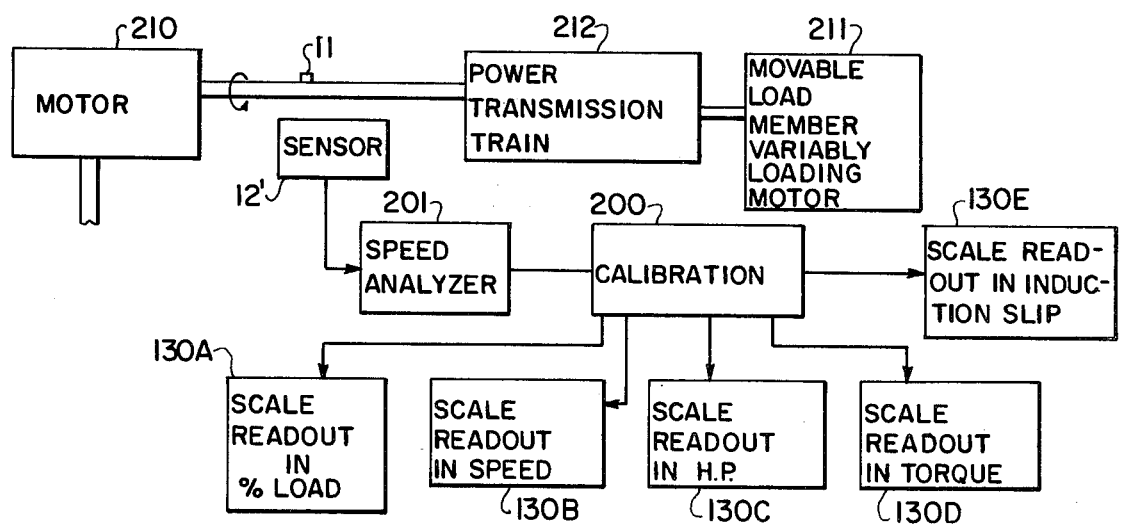
FIG. 5 is a block system diagram illustrating the calibrated scale factor features of the invention.

The general system organization as shown in the block diagram of FIG. 5 illustrates that the various special scale factors on meter 130 (FIG. 3) can be produced by a calibration device 200 which may simply switch in filters and scale factors upon demand to normalize the available analog scale current from speed analyzer circuit 201 to the various desired direct reading scale factors 130A to E for the purposes hereinbefore discussed.

If the power transmission system between motor 210 and load 211 including intermediate power transmission train 212 moves a variable loaded manually operated tool such as a drill bit, it is clear that an overload can damage either motor 210 or the movable load member (bit) and under conditions of necessary bit rotation speed could deteriorate output product quality at lower rotation speeds. Thus, the threshold may be set for sounding or displaying an alarm at an appropriate warning level so that the operator may take corrective measures.

For ready setting of the threshold alarm at a calibrated level, the meter scales 130A to E may be viewed visually for setting the threshold to operate the alarm when an observed 110% of rated full load torque, H.P., etc., for example, appears on the appropriate calibrated scale.

By viewing the FIG. 3 system, it may be seen that critically sensitive and accurate controls and measurements of the terminal load element movable member 142 occur when the detection of motor speed is made of the much higher movement speed presented by motor shaft 126. Thus, the gear reducer 145 causes shaft 141 to rotate sludge cleaning arm 142 slowly by possibly several orders of magnitude. This results in an extremely accurate and sensitive signal precisely indicating small load variations (i.e. shown by changes of speed) on the movable load member 142. This permits drive with a much lower horsepower motor of very low full load capacity.

As hereinbefore shown, there need not be any gear train fitting, wiring or special fitting of the metering device since the rotation detector can be placed at any accessible movable shaft location without contact, loading or special gearing. The electronics circuitry by use of conventional chips is self-contained and so small, that if desired the entire system may easily be mounted within the motor housing with access leads for meter connections and alarm buses where they are to be remotely positioned.

Applications of this invention can be for example by the use of a calibrated meter scale visible to an operator of a variable load motor driven tool such as in a milling machine, etc. so that overload conditions affecting motor or tool capacity will not be encountered. In this way the power train system and motor may be made less expensive and of lower power ratings. Normal engineering design is to provide an electric motor running at much more than rated capacity for normal full load conditions so that temporary overloads or unusual conditions will not damage the motor. This then causes excessive electrical power over life and still will permit motor damage under some overload conditions. Also there is no protection against breaking tools or loss of proper output quality. The present system incorporating load monitoring scales and alarms of either analog or digital nature therefore results in a more efficient system saving both energy and equipment damage, without permitting any output under low quality conditions. Such devices may even be built in as a part of the motor in the motor housing. Consider the sewage clarifying tank 140 of FIG. 3, for example. If sludge overloads scraper arm 142, the system output quality is disturbed, and even an underated motor 125 does not assure lack of damage when the load is exceeded. Thus, the systems of this invention with associated monitoring devices provides improved, efficient operation at lower power and higher quality wherever variable loads on a movable output load element can damage the system.

It is evident therefore that improved monitored power transmission systems are afforded by this invention wherever motor driven variable load producing movable members need monitoring for visual display and electronic control.

Therefore, those novel features believed descriptive of the nature and spirit of this invention are set forth with particularity in the appended claims.

What is claimed is:

1. A monitored power transmission system, comprising in combination, a motor with a characteristic that speed varies with load having a movable shaft, a motor driven movable device providing a variable load coupled to said motor shaft by power transmission means for movement at a speed determined by said motor, an analog metering device having means producing in response to said motor speed an analog speed range visible on an output meter scale, electronic calibration means in said metering device conforming the portion of the motor speed range that corresponds to peak motor load conditions to a monitored parameter related to and different from the motor speed and producing an electrical output of that parameter, and means in said metering device responsive to said electrical output of that parameter operating said metering device for displaying on said visually readable scale said monitored parameter in calibrated units displaying the variable load condition imposed on said motor.

2. A system as defined in claim 1 wherein the monitored parameter is the rated full load of the motor and the scale is calibrated to read out directly the percentage of said rated full load.

3. A system as defined in claim 1 wherein the monitored parameter is horsepower and the scale is calibrated to read out directly the horsepower.

4. A system as defined in claim 1 wherein the motor is an inductive electric motor, the monitored parameter is motor slip and the scale is calibrated to read out the motor slip speed.

5. A system as defined in claim 1 wherein the monitored parameter is torque and the scale is calibrated to read out the torque.

6. A system as defined in claim 5 wherein the torque is expressed in weight per radius arm of said motor driven movable element.

7. A system as defined in claim 5 wherein the last named element is a terminal load bearing element coupled to the power transmission system.

8. A system as defined in claim 1 wherein the power transmission system between the motor and movable device converts a rated motor speed to a movement speed of said movable device at least an order of magnitude slower, and wherein the metering device is coupled to the motor speed end of the power transmission system, thereby to provide a highly accurate and sensitive reading of the variations of speed of said movable device.

9. A system as defined in claim 8 wherein the metering device is coupled to the motor shaft to determine the motor shaft speed.

10. A system as defined in claim 1 including digitally responsive threshold setting means for establishing an on-off alarm level, and gating means decoupling said metering device when the load conditions being monitored pass through said alarm level.

11. A system as defined in claim 1 including digitally responsive alarm means detecting an abnormal system condition, and means coupling said alarm means to said metering device for disabling the meter readout in response to an abnormal condition in said system.

12. A system as defined in claim 1 wherein said power transmission system comprises a movable shaft, and said metering circuit is responsive to movement of the shaft.

13. A system as defined in claim 1 wherein said meter is coupled with threshold alarm means that provides a visual indication of speeds of a movable member in said power transmission system different from a designated threshold speed level.

14. A system as defined in claim 1 including a threshold alarm device coupled to said metering circuit to detect and provide an alarm when the movable device speed changes a specified degree.

15. A system as defined in claim 1 wherein the motor and movable device are both continuously operable in a cyclical mode of operation.

16. A system as defined in claim 1 having a motor with a full load rating substantially equal to or less than the normally encountered system load, thereby reducing system energy requirements and motor costs without reducing system operational performance or output capacity.

* * * * *